(12) United States Patent
Matsuura

(10) Patent No.: US 6,271,919 B1
(45) Date of Patent: Aug. 7, 2001

(54) SEMICONDUCTOR DEVICE AND ALIGNMENT APPARATUS AND ALIGNMENT METHOD FOR SAME

(75) Inventor: Seiji Matsuura, Tokyo (JP)

(73) Assignee: NEC Corporation, Tokyo (JP)

(*) Notice: Subject to any disclaimer, the term of this patent is extended or adjusted under 35 U.S.C. 154(b) by 0 days.

(21) Appl. No.: 09/285,024

(22) Filed: Apr. 1, 1999

(30) Foreign Application Priority Data

Apr. 2, 1998 (JP) .................................................. 10-089885

(51) Int. Cl.[7] .................................................. G01B 11/00
(52) U.S. Cl. .............................................. 356/399; 356/400
(58) Field of Search ................................... 356/399–401; 250/548

(56) References Cited

U.S. PATENT DOCUMENTS 6,008,880 * 12/1999 Higashiki et al. .................... 356/401

FOREIGN PATENT DOCUMENTS

| 63-237522 | 10/1988 | (JP) . |
| 64-25413 | 1/1989 | (JP) . |
| 1-20529 | 4/1989 | (JP) . |
| 2-150013 | 6/1990 | (JP) . |
| 2-63287 | 12/1990 | (JP) . |
| 6-29183 | 2/1994 | (JP) . |

* cited by examiner

Primary Examiner—Frank G. Font
Assistant Examiner—Zandra V. Smith
(74) Attorney, Agent, or Firm—Sughrue, Mion, Zinn, Macpeak & Seas, PLLC

(57) ABSTRACT

In a semiconductor device having first alignment marks formed on a first layer and second alignment marks formed on a second layer, the first alignment marks and second alignment marks are disposed so as to be approximately as close to each other as a diffraction grating distance X.

5 Claims, 4 Drawing Sheets

(a)

(b)

(c)

SEMICONDUCTOR DEVICE AND ALIGNMENT APPARATUS AND ALIGNMENT METHOD FOR SAME

BACKGROUND OF THE INVENTION

1. Field of the Invention

The present invention relates to a semiconductor device, and an associated alignment apparatus and alignment method, and more particularly it relates to a semiconductor device having an alignment mark that occupies a reduced surface area, and an alignment apparatus suitable for this semiconductor device that shortens the alignment time.

2. Description of the Related Art

In an alignment apparatus, when alignment marks that are formed in different base layers are used to perform alignment, in the case for example in which the alignment marks in the lowermost layer are used to perform alignment on the upper layer, because light used in the alignment passes through an interlayer film, an error occurs, this resulting in a reduction of alignment accuracy.

In the case in which the alignment marks that are formed on the upper layer are used to achieve positioning, that is, alignment, between a mask and a wafer, because of the cumulative errors that are included in each mark formed in the various process steps, there is a problem with alignment error.

In general, the selection of the ideal alignment marks to use is done at each alignment separately during the alignment steps.

For this reason, because alignment upper layers is performed by detecting the alignment marks formed in each layer and comparing this data so as to select the best alignment mark, the processing of alignment took a great deal of time in the past.

In the past, alignment marks, as shown in FIG. 5, have a width in the scanning direction of (diffraction grating distance X)×(diffraction grating number of lines), this being a width of 100 µm or greater, and because alignment is performed with a plurality of base layers, the alignment marks, as denoted by 21 and 22 in FIG. 5, inevitably occupy a considerable amount of surface area, this presenting the problem of hindering the achievement of a high degree of integration in the semiconductor integrated circuit.

Known alignment apparatuses are such as described, for example, in Japanese Unexamined Patent Publication (KOKAI) No.63-237522, Japanese Examined Patent Publication (KOKOKU) No.1-20529, Japanese Examined Patent Publication (KOKOKU) No.2-63287, Japanese Unexamined Patent Publication (KOKAI) No.64-25413, but these alignment apparatuses do not solve the above-described problems.

Accordingly, it is an object of the present invention to provide a solution to the drawbacks in the prior art as noted above, and in particular to provide a novel semiconductor device that alignment marks having a reduction in the surface area occupied on the semiconductor chip.

Another object of the present invention is to provide a novel alignment apparatus and alignment method that reduce the amount of time required to perform alignment.

SUMMARY OF THE INVENTION

In order to achieve the above-noted object, the present invention adopts the following basic technical constitution.

Specifically, an embodiment of the present invention is a semiconductor device having first alignment marks formed on a first layer and second alignment marks formed on a second layer that is different from said first layer, wherein said first alignment marks and said second alignment marks are disposed so as to be at a distance from each other that is approximately a diffraction grating distance.

A first aspect of an alignment apparatus according to the present invention is an alignment apparatus for a semiconductor device having first alignment marks formed on a first layer and second alignment marks formed on a second layer that is different from the first layer, this alignment apparatus having a first detection means for determining the position coordinates of the second alignment marks with respect to the first alignment marks, a second detection means for detecting the position skew (the position offset) between the first alignment marks and the second alignment marks, the position of which was detected by the first detection means, a third detection means that detects whether or not the distribution of the position skew detected by the second detection means is within a prescribed value, and an alignment execution means that performs alignment by selecting the second alignment marks when the third detection means detects that the distribution of skew is within the prescribed value.

In the second aspect of the present invention, the skew distribution is 3σ.

The third aspect of an alignment apparatus according to the present invention is an alignment apparatus for a semiconductor device having first alignment marks formed on a first layer and second alignment marks formed on a second layer that is different from the first layer, this alignment apparatus having a first detection means for determining the position coordinates of the second alignment marks with respect to the first alignment marks, a second detection means for detecting the position skew between the first alignment marks and the second alignment marks, the position of which was detected by the first detection means, a third detection means that detects whether or not the distribution of the skew detected by the second detection means is within a prescribed value, a fourth detection means that corrects, from the position coordinates that are detected by the first detection means, the linear error component such as the position offset of the second alignment marks with respect to the first alignment marks, and detects the residual error thereof, a fifth detection means that detects whether or not the residual error detected by the fourth detection means is within a prescribed value, and an alignment execution means for performing alignment by selecting said second alignment marks in the case in which not only does said third detection means detect that said skew distribution is within its prescribed value, but also said fifth detection means detects that said residual error is within its prescribed value.

In the fourth aspect of the present invention, the second alignment marks are formed in a layer that is above the layer on which the first alignment marks are formed.

In the fifth aspect of the present invention, the first and second alignment marks are disposed so as to be approximately as close to each other as the diffraction grating distance.

The first aspect of an alignment method according to the present invention is an alignment method for a semiconductor device having first alignment marks formed on a first layer and second alignment marks formed on a second layer that is different from the first layer, this alignment method having a first step of determining the position coordinates of the second alignment marks with respect to the first alignment marks, a second step of detecting the position skew between the first alignment marks and the second alignment marks, the position of which was detected by first step, a third step of detecting whether or not the distribution of the position skew detected by the second step is within a prescribed value, a fourth step of performing alignment by selecting the second alignment marks when the third step detects that the position skew distribution was within the prescribed value.

The second aspect of an alignment method according to the present invention is an alignment method for a semiconductor device having first alignment marks formed on a first layer and second alignment marks formed on a second layer that is different from the first layer, this alignment method having a first step of determining the position coordinates of the second alignment marks with respect to the first alignment marks, a second step of detecting the position skew between the first alignment marks and the second alignment marks, the position of which was detected by first step, a third step of detecting whether or not the distribution of the position skew detected by the second step is within a prescribed value, a fourth step of correcting the linear error component such as the offset of the second alignment marks with respect to the first alignment marks, using the position coordinates detected by the first step, and detecting the residual error thereof, a fifth step of detecting whether or not the residual error detected by the fourth step is within a prescribed value, and a sixth step of performing alignment by selecting the second alignment marks when the third step detects that the position skew distribution was within its prescribed value and also the fifth step detects that the residual error is within its prescribed value.

A semiconductor device according to the present invention has first alignment marks formed on a first layer and second alignment marks formed on a second layer that is different from the first layer. Because the first alignment marks and the second alignment marks are disposed so as to be approximately as close to each other as the diffraction grating distance, the surface area occupied by the alignment marks on the chip is reduced, enabling a higher degree of integration.

An alignment apparatus according to the present invention is an alignment apparatus for a semiconductor device having first alignment marks formed on a first layer and second alignment marks on a second layer that is different from the first layer. This alignment apparatus has a first detection means for determining the position coordinates of the second alignment marks with respect to the first alignment marks, a second detection means for detecting the position skew between the first alignment marks and the second alignment marks, the position of which was detected by the first detection means, a third detection means that detects whether or not the distribution of the position skew detected by the second detection means is within a prescribed value, and an alignment execution means that performs alignment by selecting the second alignment marks when the third detection means detects that the distribution of skew is within the prescribed value. By virtue of this constitution, the selection of alignment marks does not require much time and, for this reason, the time required for alignment is shortened, and productivity is improved.

DESCRIPTION OF THE PREFERRED EMBODIMENTS

Embodiments of a semiconductor device, and alignment apparatus, and an alignment method according to the present invention are described in detail below, with references being made the relevant accompanying drawings.

FIG. 1(a) through FIG. 1(c) are drawings that show an embodiment of semiconductor device according to the present invention, this showing a semiconductor device that has first alignment marks 1 formed on a first layer 5 and second alignment marks 2 formed on a second layer 6, which is different from the first layer 5, the first alignment marks 1 and the second alignment marks 2 being approximately as close to one another as the diffraction grating distance X.

Figure 2:
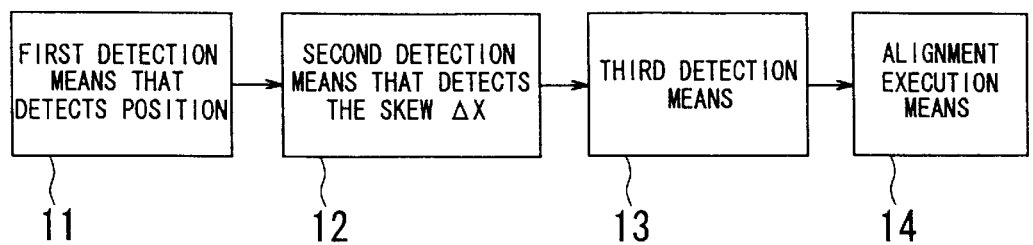
FIG. 2 is a functional block diagram that shows an embodiment of an alignment apparatus according to the present invention.

FIG. 2 is a functional block diagram of an alignment apparatus according to the present invention, this being an alignment apparatus for a semiconductor device that has first alignment marks 1 formed on a first layer 5 and second alignment marks 2 formed on a second layer 6, which is different from the first layer 5, the alignment apparatus having a first detection means 11 for determining the position coordinates of the second alignment marks 2 with respect to the first alignment marks 1, a second detection means 12 for detecting the position skew (the position offset) $\Delta X$ between the first alignment marks 1 and the second alignment marks 2, the positions of which was detected by the first detection means, a third detection means 13 that detects whether or not the distribution of the skew $\Delta X$ as detected by the second detection means 12 is within a prescribed value, and an alignment execution means 14 that performs alignment using the second alignment marks 2 when the third detection means 13 detects that the skew $\Delta X$ is within the prescribed value.

Another embodiment has a first detection means for determining the position coordinates of the second alignment marks 2 with respect the first alignment marks 1, a second detection means 12 for detecting the position skew $\Delta X$ between the first alignment marks 1 and the second alignment marks 2, a third detection means 13 for detecting whether or not the distribution of the skew $\Delta X$ as detected by the second detection means 12 is within a prescribed value, a fourth detection means for correcting the linear error component such as offset of the position of the second alignment marks 2 with respect to the first alignment marks 1, based on the position coordinates that were detected by the first detection means 11 and detecting the residual error thereof, a fifth detection means 16 for detecting whether or not the residual error detected by the fourth detection means 15 is within a prescribed value, and an alignment means 17 for performing alignment by selecting the second alignment marks 2 when the third detection means 13 detects that the skew ΔX is within its prescribed value and also the fifth detection means 16 detects that the residual error is within its prescribed value.

The present invention is described in further detail below.

Figure 1:
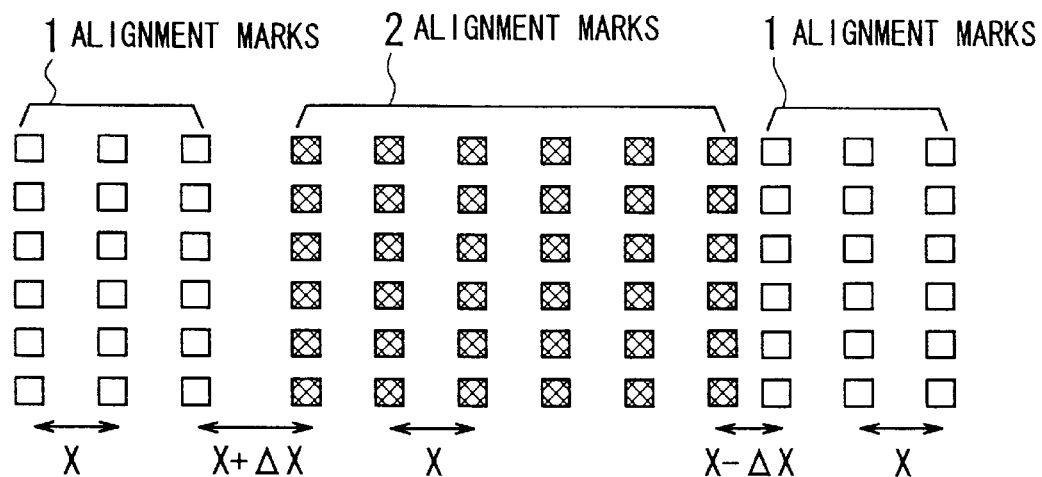
FIG. 1 is a drawing that illustrates the alignment marks in a semiconductor device according to the present invention, with FIG. 1(a) being a plan view of the alignment marks, FIG. 1(b) being a drawing that shows the positional relationshop between the chip and the alignment marks, and FIG. 1(c) being a cross-sectional view that shows the condition of alignment marks formed on different layers.
Figure 1:
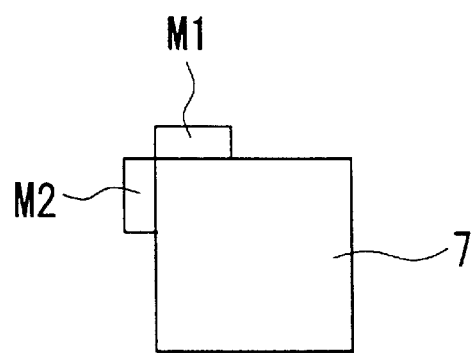
Figure 1:
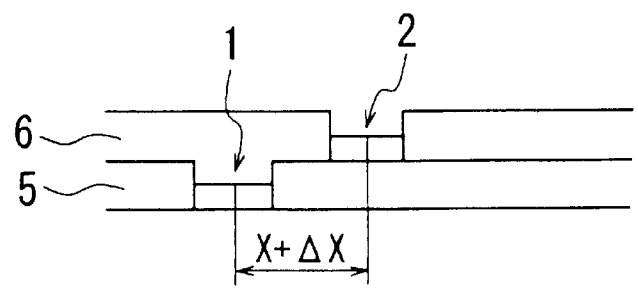

The alignment marks of FIG. 1 (hereinafter simply referred to as marks) are the type of marks that are used to detect diffracted light by scanning while shining monochromatic light onto a diffraction grating, two of these marks, M1 and M2, being provided adjacent to areas 7 in which chips are formed for the purpose of detection of position in the X and Y directions.

The first layer marks 1 and the marks 2 that are formed on a layer above the first layer a disposed so as to be approximately as close to each other as the diffraction grating distance X, these forming the marks M1 and M2.

Because of alignment error, stage movement error, mark positioning error on the reticle and other errors, the first and second marks are skewed by ΔX and exhibit dispersion as well.

In FIG. 1(a), the lower-layer marks (indicated as white squares) formed in a first step are disposed to both the left and right, and the upper-layer marks (indicated by filled-in squares) formed in a second step are disposed between the marks 1. As long as the marks 1 formed by the first step and the marks 2 formed by the second step are disposed so that the distance between them is approximately the diffraction grating distance X, any positioning of these marks can be done.

FIG. 2 is a functional block diagram of an alignment apparatus suitable for alignment of the above-described semiconductor device. This alignment device and the associated alignment method will be described with reference made to this block diagram.

In FIG. 2, the reference numeral 11 denotes a first detection means for determining the position coordinates of the second alignment marks 2 with respect to the first alignment marks 1, 12 is a second detection means for detecting the position skew ΔX between the second alignment marks 2 and the first alignment marks 1, the positions of which was detected by the first detection means 11, 13 is a third detection means that detects whether or not the distribution of the skew ΔX of the marks that was detected by the second detection means 12 is within a prescribed value of 3σ, and 14 is an alignment means that performs alignment by selecting the second alignment marks 2 when the third detection means 13 detects that the distribution of the skew ΔX is within the prescribed value of 3σ.

In the case in which the third detection means 13 detects that the distribution of the skew A X is not within the prescribed value of 3σ, the alignment is performed by selecting the other alignment marks.

Using an alignment apparatus according to the present invention configured in this manner, because the first layer marks 1 and the second layer marks 2 are approximately as close to each other as the diffraction grating distance X, it is possible to make a selection of the marks to be used automatically with a single scan, thereby enabling a shortening of the time required for alignment, in comparison with an alignment apparatus in the prior art.

In the above-noted case the detected signal waveform from the marks 2 must absolutely, of course, be of good quality.

Next, another embodiment of the present invention will be described, with reference being made to FIG. 3 and FIG. 4.

Figure 3:
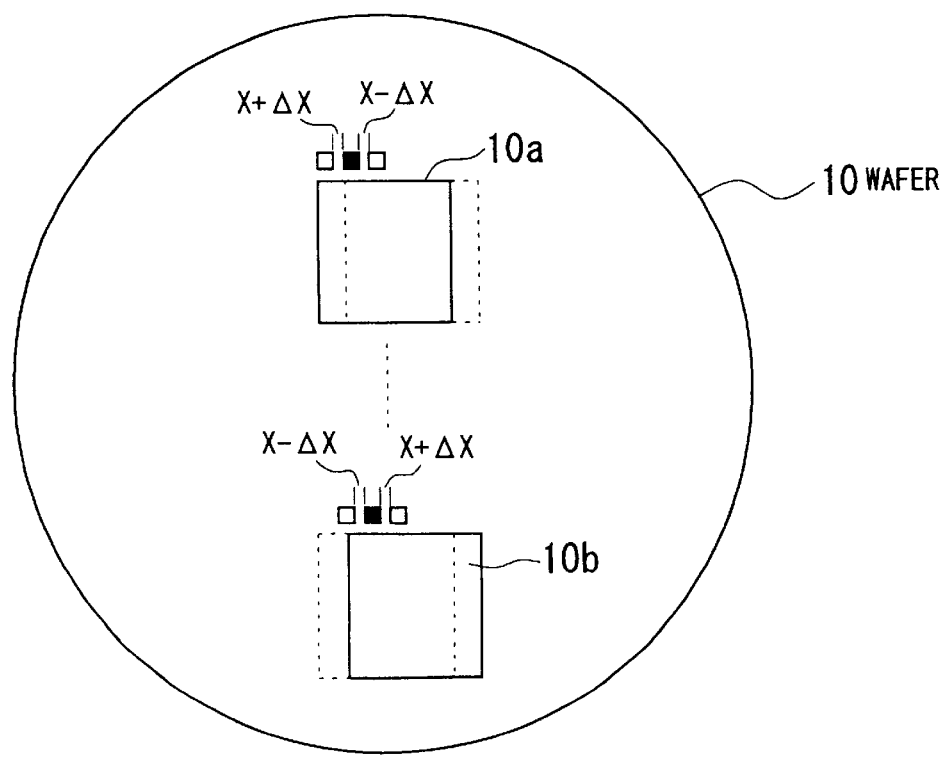
FIG. 3 is a drawing that illustrates the linear error component such as offset.

As shown in FIG. 3, the first alignment marks 1 and the second alignment marks 2 are skewed by an amount of ΔX (as indicated by the broken line, the second marks are skewed to the right), and the first alignment marks 1 and the second alignment marks 2 on the opposite side of the wafer 10 are skewed by an amount of −ΔX (as indicated by the broken line, the second marks are skewed to the left). In a case such as this, because it is generally possible to perform correction of linear error components, the residual error components are determined after correction and, if the residual error is within a set value, it is possible to perform alignment with good accuracy using the second alignment marks 2.

Figure 4:
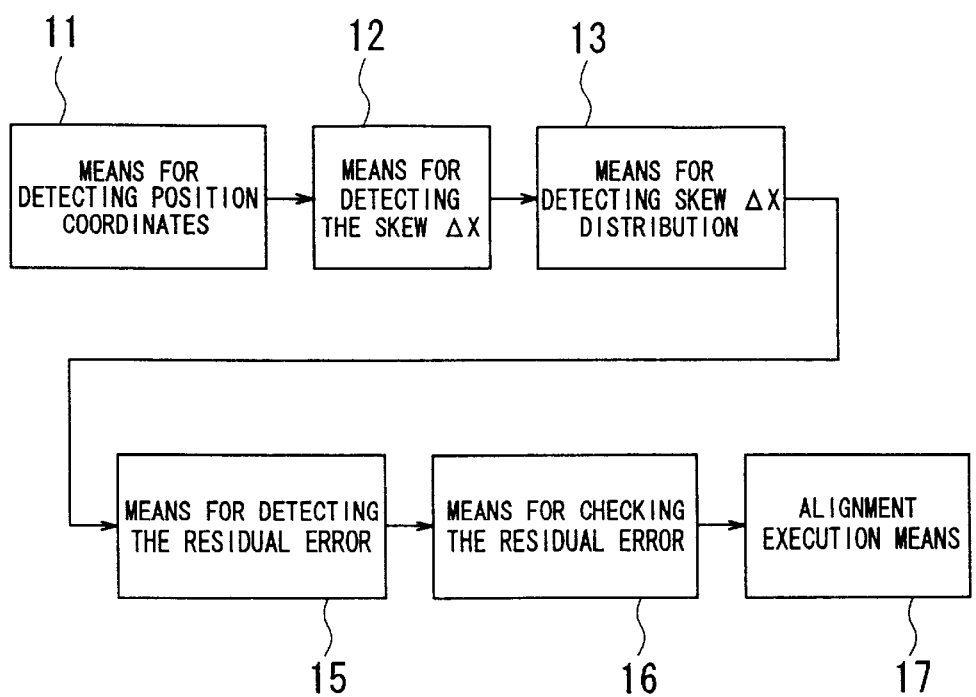
FIG. 4 is a functional block diagram that shows another embodiment of an alignment apparatus according to the present invention.
Figure 5:
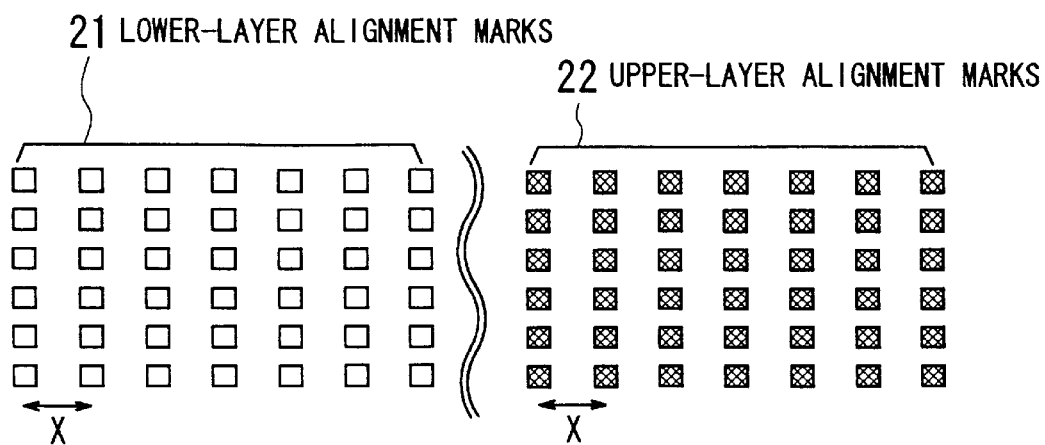
FIG. 5 is a drawing that shows alignment marks in the according to the prior art.

FIG. 4 is a block diagram that shows an embodiment of an alignment apparatus for the case of performing alignment by correction of linear error components such as offset.

In addition to the elements of the first embodiment, this alignment apparatus has a fourth detection means for correcting linear error components, such as offset in the position of the second alignment marks 2 with respect to the first alignment marks 1, based on the position coordinates detected by the first detection means 11, and detecting of the residual error thereof, a fifth detection means 16 for detecting whether or not the residual error detected by the fourth detection means 15 is within a prescribed value (for example, 3σ), and an alignment execution means 17 that performs alignment by selecting the second alignment marks 2, when not only does the third detection means 13 detect that the skew ΔX is within its prescribed value, but also the fifth detection means detects that the residual error is within its prescribed value.

While the above description is for the case in which the first and second alignment marks 1 and 2 are provided on an upper and lower layer, respectively, it should be considered that the present invention would apply as well to the case of image processing. And furthermore the present invention would apply to a group of alignment marks of more than 3 sets, in which each mark is disposed on a different layers.

By adopting the above-described constitution, the alignment method according to the present invention automatically selects the optimum alignment marks based on the alignment residual error and signal waveform strength and, by doing so, improves the accuracy of alignment. Additionally, because alignment marks formed on different base layers are brought into proximity with each other, this is possible with a single scanning and detection pass, thereby shortening the time required for detection of alignment marks, as compared with the time required to detect alignment marks on different base layers in the past.

Additionally, because the upper-layer and lower-layer alignment marks in a semiconductor device according to the present invention are disposed so as to be in mutual proximity, it is possible to reduce the amount of surface space the alignment marks occupy on a chip, thereby contributing to the achievement of a high degree of integration.

What is claimed is:

1. An alignment apparatus for a semiconductor device having first alignment marks formed on a first layer and second alignment marks formed on said second layer, said alignment apparatus comprising:

a first detection means for determining the position of said second alignment marks with respect to said first alignment marks;

a second detection means for detecting the skew between the position of said second alignment marks and the position of said first alignment marks that are detected by said first detection means;

a third detection means for detecting whether or not the distribution of the skew detected by said second detection means is within a prescribed value; and an alignment execution means for performing alignment by selecting said second alignment marks in the case in which said third detection means detects that said skew distribution is within said prescribed value.

2. An alignment apparatus according to claim 1, wherein said prescribed value is a distribution of 3σ.

3. An alignment apparatus for a semiconductor device having first alignment marks formed on a first layer and second alignment marks formed on a second layer, said alignment apparatus comprising:

a first detection means for detecting the position of said second alignment marks with respect to said first alignment marks;

a second detection means for detecting the skew between the position of said second alignment marks and the position of said first alignment marks that are detected by said first detection means;

a third detection means for detecting whether or not the distribution of skew detected by said second detection means is within a prescribed value;

a fourth detection means for correcting a linear error component such as position offset of said second alignment marks with respect to said first alignment marks, and detecting the residual error thereof;

a fifth detection means for detecting whether or not said residual error detected by said fourth detection means is within a prescribed value; and an alignment execution means for performing alignment by selecting said second alignment marks in the case in which not only does said third detection means detect that said skew distribution is within its prescribed value, but also said fifth detection means detects that said residual error is within its prescribed value.

4. An alignment apparatus according to claim 1, wherein said second alignment marks are formed on a layer that is disposed above the layer on which said first alignment marks are formed.

5. An alignment apparatus according to claim 1, wherein said first alignment marks and said second aligment marks are disposed so as to be approximately as close to each other as a diffraction grating distance.

* * * * *